United States Patent
Sugie

(10) Patent No.: US 8,410,738 B2
(45) Date of Patent: Apr. 2, 2013

(54) SEMICONDUCTOR DEVICE

(75) Inventor: Hisashi Sugie, Kyoto (JP)

(73) Assignee: Rohm Co., Ltd. (JP)

( * ) Notice: Subject to any disclaimer, the term of this patent is extended or adjusted under 35 U.S.C. 154(b) by 443 days.

(21) Appl. No.: 12/834,412

(22) Filed: Jul. 12, 2010

(65) Prior Publication Data

US 2011/0187302 A1    Aug. 4, 2011

(30) Foreign Application Priority Data

Jul. 13, 2009   (JP) ................................ 2009-164979
Jun. 7, 2010    (JP) ................................ 2010-130017

(51) Int. Cl.
*H02P 6/00* (2006.01)

(52) U.S. Cl. ..................... 318/400.29; 326/16

(58) Field of Classification Search ............ 318/400.29; 257/782; 716/104; 326/16; 327/107; 324/762.01
See application file for complete search history.

(56) References Cited

U.S. PATENT DOCUMENTS 7,913,202 B2 *   3/2011   Bernstein et al. ............. 716/104

* cited by examiner

*Primary Examiner* — Karen Masih
(74) *Attorney, Agent, or Firm* — Cantor Colburn LLP

(57) ABSTRACT

Multiple pads are provided to a semiconductor chip of a semiconductor device. A first pad is arranged on a path for a first signal set to a voltage that corresponds to a first level in the active state. The first signal is input to the semiconductor chip from outside the semiconductor device, or is output to outside the semiconductor device from the semiconductor chip. A second pad is provided in order to receive a setting voltage. A first pin is connected to a first pad via a connection member, and receives the first signal from outside the semiconductor device, or from the semiconductor chip via the first pad. A second pin receives, from outside, a second signal set to a voltage that corresponds to the first level or a second level which is the complement of the first level.

25 Claims, 5 Drawing Sheets

○ INPUT/OUTPUT TRUTH TABLE

| INPUT MODE | INPUT | | | | OUTPUT | |
|---|---|---|---|---|---|---|
| | PS※5 | PWM | INA | INB | OUTA | OUTB |
| EN/IN | H | H | L | X | L | L |
| | | | H | L | H | L |
| | | | H | H | L | H |
| IN/IN | | L | L | L | Z | Z |
| | | | H | L | H | L |
| | | | L | H | L | H |
| | | | H | H | L | L |
| - | L | X | X | X | Z | Z |

L; Low, H; High, X; Don't care, Z; Hi impedance
※5 INPUT LOGICAL VALUE AT PS TERMINAL
   HIGH; IC ACTIVE STATE, LOW; IC STANDBY STATE

FIG.5B

○ OUTPUT SWITCHING SPEED (H Bridge)
CONDITION Ta=25°C, VCC=3.0V, VM=5.0V    UNIT ; ns

| TR1 | TR2 | TURN-ON TIME | TURN-OFF TIME |
|---|---|---|---|
| Low | Low | 150 | 50 |
| High | Low | 250 | 70 |
| Low | High | 350 | 90 |
| High | High | 500 | 110 |

# SEMICONDUCTOR DEVICE

BACKGROUND OF THE INVENTION

1. Field of the Invention

The present invention relates to a semiconductor device.

2. Description of the Related Art

An electronic device mounts various semiconductor devices having various kinds of functions, examples of which include a power supply circuit, a motor driver, an LED (Light Emitting Diode), a DSP (Digital Signal Processor).

In some cases, a designer or a manufacturer of electronic devices (who will be referred to as the "set maker" hereafter) desires to switch the operation mode or the function of the semiconductor device as desired from outside the semiconductor device. In order to fulfill such a request, a designer or a manufacturer of semiconductor devices (who will be referred to as the "device supplier" hereafter) provides several control pins to a semiconductor device, which allows the set maker to set the operation mode and the function of the semiconductor device from outside the semiconductor device.

FIG. 1 is a diagram which shows an example configuration of a typical semiconductor device. A semiconductor device 200 includes a semiconductor chip 202, a substrate 204, and multiple pins PIN. The semiconductor chip 202 includes multiple pads PAD1 through PAD5. For example, the pad PAD1 functions as a power supply pad via which a power supply voltage Vdd is supplied. The third pad PAD3 functions as an input pad via which an input signal to be processed is received. The fourth pad PAD4 functions as an output pad via which the processed signal is output. The semiconductor chip 202 is configured so as to allow the state and the function (which will be collectively referred to as the "state" hereafter) to be switched according to the values of control signals input to the first pad PAD1 and the second pad PAD2. In a case in which each of the two control signals can be set to one of two levels, i.e., a high level or a low level, such an arrangement allows the semiconductor chip 202 to switch the state between a maximum of four states.

The semiconductor chip 202 is mounted on the substrate 204. Multiple pins PIN that correspond to the multiple pads PAD are fixed to the substrate 204. The pins PIN and the corresponding pads PAD are electrically connected by means of connection members such as bonding wires or the like. With such an arrangement, the semiconductor chip 202 can be set to a desired state by supplying the control signals, each of which can be set to high level or low level, to the control pins PIN1 and PIN2 connected to the first pad PAD1 and the second pad PAD2.

Such an arrangement has a problem in that an increase in the number of control signals leads to an increase in the number of pins PIN. Such an increase in the number of pins PIN leads to an increased package size, consequently limiting the size of the electronic device. Furthermore, this leads to an increase in the cost of the semiconductor device.

SUMMARY OF THE INVENTION

The present invention has been made in view of such a situation. Accordingly, it is an exemplary purpose of an embodiment of the present invention to provide a reduced-size semiconductor device.

An embodiment of the present invention relates to a semiconductor device. The semiconductor device comprises: multiple pins; a semiconductor chip having multiple pads which allow signals to be input and output, and configured to execute signal processing in one state selected from among multiple states according to at least one given setting voltage; and connection members configured to connect the multiple pads to corresponding pins. The multiple pads comprise: a first pad arranged on a path for a first signal which is set to a voltage that corresponds to a first level when the semiconductor device is in an active state, and which is input to the semiconductor chip from outside the semiconductor device, or which is output from the semiconductor chip to outside the semiconductor device; and at least one second pad configured to receive the aforementioned at least one setting voltage. The multiple pins comprise: a first pin which is connected to the first pad via the connection member, and which is configured to receive the first signal from outside the semiconductor device or from the semiconductor chip via the first pad; and a second pin configured to receive a second signal which is set to a voltage that corresponds to the first level or a second level that is the complement of the first level.

With such an embodiment, in a case in which there is a desire to apply the first level to a given second pad, the second pad should be connected to the first pin by means of a connection member, and in a case in which there is a desire to apply the second level to the second pad, the second pad should be connected to the second pin, and a voltage that corresponds to the second level should be supplied to the second pin from the outside.

With such an embodiment, there is no need to increase the number of pins even if the number of second pads is increased, thereby providing a reduced-size semiconductor device.

Also, the first pad and the aforementioned at least one second pad may be arranged adjacent to one another. Also, the first pin and the second pin may be adjacently arranged. Also, the first pad may be arranged at a position in the vicinity of the first pin. Also, the aforementioned at least one second pad may be arranged at a position in the vicinity of the first pin and the second pin.

Such an arrangement reduces the length of a signal transmission path formed by means of the connection members, thereby simplifying the mounting operation and the assembling operation.

Another embodiment of the present invention also relates to a semiconductor device. The semiconductor device comprises: multiple pins; a semiconductor chip having multiple pads which allow signals to be input and output, and configured to execute signal processing in one state selected from among multiple states according to at least one given setting voltage; and connection members configured to connect the multiple pads to the corresponding pins. The multiple pads comprise: a first pad arranged on a path for a first signal which is set to a voltage that corresponds to a first level when the semiconductor device is in an active state, and which is input to the semiconductor chip from outside the semiconductor device, or which is output from the semiconductor chip to outside the semiconductor device; at least one second pad configured to receive the aforementioned at least one setting voltage; and a third pad arranged on a path for a third signal which is set to a voltage that corresponds to a second level when the semiconductor device is in the active state, and which is input to the semiconductor chip from outside the semiconductor device, or which is output from the semiconductor chip to outside the semiconductor device. The multiple pins comprise: a first pin which is connected to the first pad via the connection member, and is configured to receive the first signal from outside the semiconductor device or from the semiconductor chip via the first pad; and a third pin which is connected to the third pad via the connection member, and is configured to receive the third signal from outside the semiconductor device or from the semiconductor chip via the third pad. The first pad, the aforementioned at least one second pad, and the third pad are arranged adjacently. The first pin and the third pin are arranged adjacently. The first pad is arranged at a position in the vicinity of the first pin. The aforementioned at least one second pad is arranged in the vicinity of the first pad and the third pad. The third pad is arranged at a position in the vicinity of the third pin.

In a case in which there is a desire to apply the first level to a given second pad, this second pad should be connected to the first pin by means of a connection member. On the other hand, in a case in which there is a desire to apply the second level to this second pad, this second pad should be connected to the third pin. With such an embodiment, there is no need to increase the number of pins even if the number of the second pads is increased, thereby providing a reduced-size semiconductor device.

Also, the first signal may be a power saving signal which is set to a voltage that corresponds to the first level when the semiconductor device is to be in the active state, and which is set to a voltage that corresponds to the second level when the semiconductor device is to be in the standby state.

Also, the first level may be high level, and the first signal may be supplied as a power supply voltage from the outside.

Also, the first level may be low level, and the first signal may be supplied as a ground voltage which is to be used as a reference voltage for the semiconductor chip.

Also, the first signal may be a notification signal which is used to send notice of the state of the semiconductor device to outside the semiconductor device. Also, the first signal may be a notification signal which is set to the first level when the semiconductor device is in the active state, and is set to the second level when the semiconductor device in the inactive state.

Also, the connection member may be configured as a bonding wire.

Also, the semiconductor device may be configured as a chip size package. Also, the connection member may be configured as a rerouting wire.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 5A is a table which shows the correspondence relation between the input signals and the output signals of the semiconductor device, and FIG. 5B is a table which shows the relation between the logical level of each pad and the turn-on time and the turn-off time.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

[First Embodiment]

Figure 1:
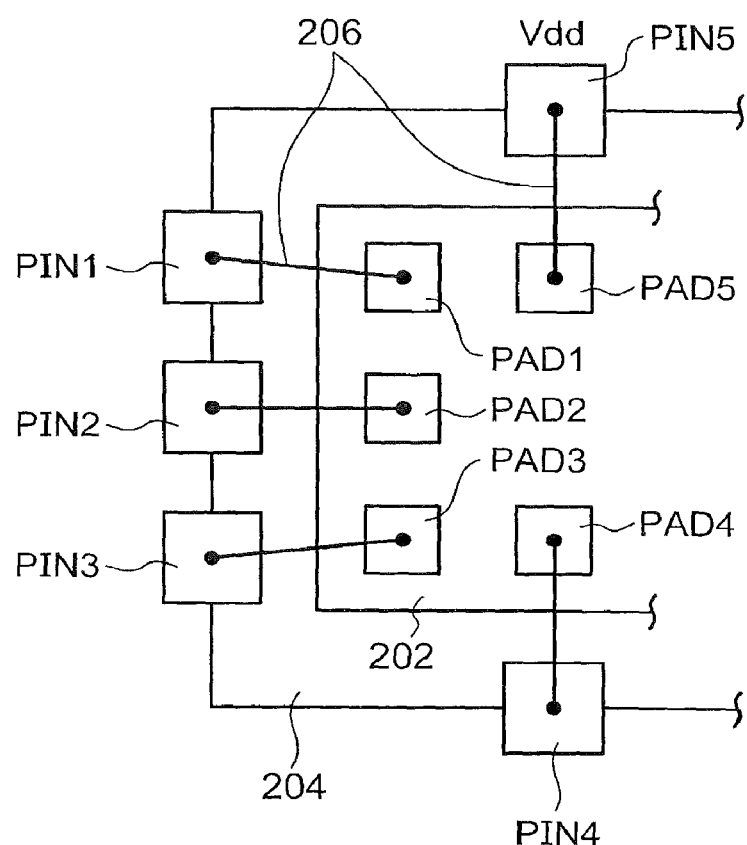
FIG. 1 is a diagram which shows a portion of an example configuration of a typical semiconductor device.
Figure 2:
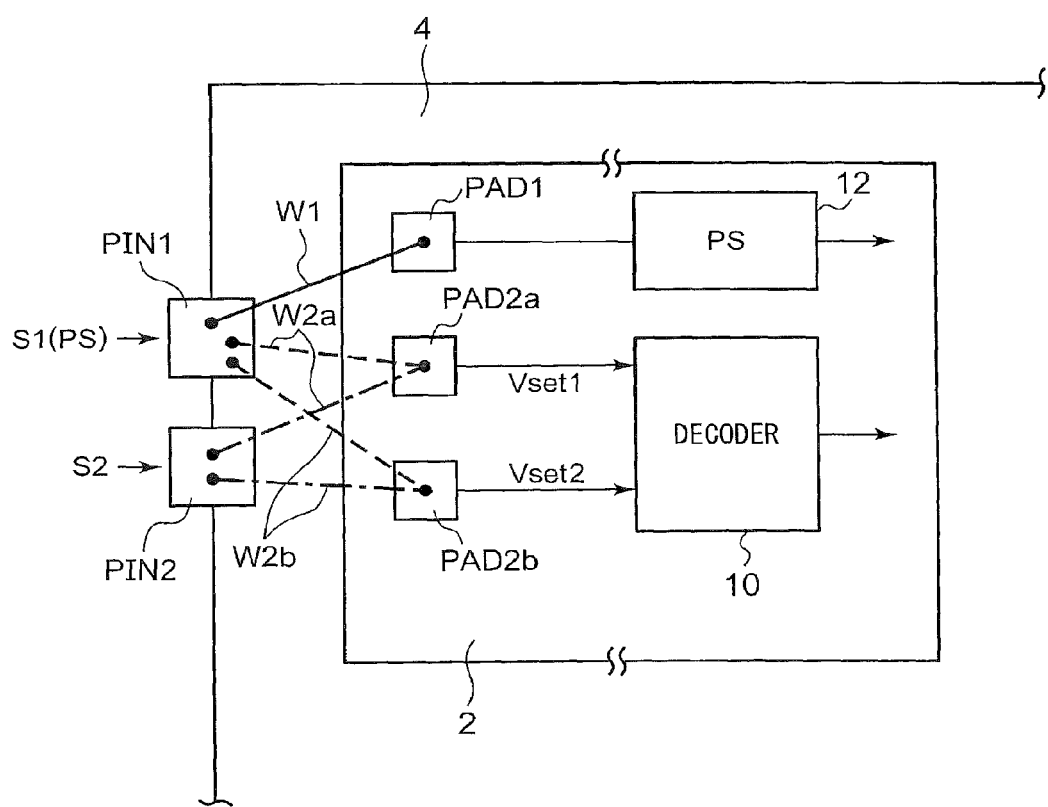
FIG. 2 is a diagram which shows a portion of a configuration of a semiconductor device according to a first embodiment.

FIG. 2 is a diagram which shows a portion of a configuration of a semiconductor device 100 according to a first embodiment. The semiconductor device 100 includes multiple pins PIN, a semiconductor chip 2, a substrate 4, and connection members W. The semiconductor chip 2 includes multiple pads PAD which allow signals to be input and output. In the drawing, two pins PIN1 and PIN2 and three pads PAD1, PAD2a, and PAD2b are shown, and other pins and pads are not shown.

The connection members W connect the multiple pads PAD to the corresponding pins PIN.

For example, the semiconductor device 100 may have a QFP structure. In this case, the pins PIN and the substrate 4 are provided as the lead frame, and the connection members W are provided as the bonding wires. Alternatively, the semiconductor device 100 may have a CSP structure. In this case, the pins PIN are provided as solder bumps, and the connection members W may be rerouting wires integrally formed with the substrate 4. Also, the semiconductor device 100 may have any structure which may be available presently or in the future.

The second chip 2 has a configuration which allows the state to be switched between multiple states. The semiconductor chip 2 executes signal processing in one state according to at least one input setting voltage Vset. With the present embodiment, the semiconductor chip 2 can be switched between four states, and one state is selected and set according to two setting voltages Vset1 and Vset2.

The semiconductor chip 2 includes a decoder 10 configured to receive the setting voltages Vset1 and Vset2, and to switch the state of the semiconductor chip 2 according to the values of the setting voltages thus received. The term "state" as used here represents an item which is associated with the operation mode, the signal processing content, the signal processing parameters, or the like, thereby allowing the states to be distinguished from one another. That is to say, the setting voltages Vset affect the processing performed by the semiconductor chip 2.

The second pads PAD2a and PAD2b are provided in order to receive the setting voltages Vset1 and Vset2, respectively, and are connected to the decoder 10.

The decoder 10 detects the values of the setting voltages Vset1 and Vset2 (high level or low level) at a timing after the semiconductor chip 2 starts to operate, and determines the state of the semiconductor chip 2.

The relations between the setting voltages Vset1 and Vset2 and the states φ1 through φ4 are listed below.

When (Vset1, Vset2)=(L, L), the first state φ1 is selected.
When (Vset1, Vset2)=(L, H), the second state φ2 is selected.
When (Vset1, Vset2)=(H, L), the third state φ3 is selected.
When (Vset1, Vset2)=(H, H), the fourth state φ4 is selected.

Here, "H" represents high level, and "L" represents low level.

The first pad PAD1 is arranged on a path for a first signal S1 which is set to a voltage that corresponds to a first level (hereafter taken to be high level) in the active state of the semiconductor device 100. The first signal S1 is input to the semiconductor chip 2 from outside the semiconductor device 100. Alternatively, the first signal S1 is output from the semiconductor chip 2 to outside the semiconductor device 100.

For example, the first signal S1, which is transmitted via the first pad PAD1, is a power saving signal PS which is set to a voltage that corresponds to a first level (high level) when the semiconductor device 100 is to be set to the active state, and which is set to a second level (low level) when the semiconductor device 100 is to be set to the standby state. The first signal S1 is input from outside the semiconductor device 100.

A power saving control unit 12 receives a power saving signal (first signal) PS, and controls the standby state of the semiconductor chip 2 according to the level of the power saving signal PS, thereby reducing power consumption of the semiconductor chip 2.

The first pin PIN1 is connected to the first pad PAD1 via the connection member W1, which allows the first signal to be received from outside the semiconductor device 100, or from the semiconductor chip 2 via the first pad PAD1. With the present embodiment, the first pin PIN1 receives the power saving signal PS from outside the semiconductor device 100.

The second pin PIN2 is provided in order to receive, from the outside, a second signal which is set to a value that corresponds to the first level (high level) or a second level (low level) which is the complement of the first level. In the present embodiment, two second pins PIN2 are provided. However, the number of second pins PIN2 may be determined as desired.

Next, description will be made regarding a suitable layout of the pads and the pins.

The first pad PAD1 and at least one pad, e.g., the second pads PAD2a and PAD2b are arranged adjacently. Furthermore, the first pin PIN1 and the second pin PIN2 are arranged adjacently. Moreover, the first pad PAD1 is arranged at a position in the vicinity of the first pin PIN1, and the second pads PAD2a and PAD2b are arranged at positions in the vicinity of the first pin PIN1 and the second pin PIN2. Here, the phrase "in the vicinity of" means that the pin and the pad are arranged in a region where they can be connected together by means of a connection member.

The above is the basic configuration of the semiconductor device 100. Next, description will be made regarding the usage of the semiconductor device 100.

In some cases, the state of the semiconductor device 100 should be set depending only on the type of electronic device which mounts the semiconductor device 100. That is to say, there is no need to dynamically switch the state of the semiconductor device 100. In this case, the semiconductor device supplier should supply semiconductor devices configured to operate in states required by the set maker, as described below. The supplier varies the connection states of the second pads PAD2a and PAD2b for each kind of device.

1. Device which can Operate in the Fourth State φ4

The second pad PAD2a is connected to the first pin PIN1 by means of a connection member W2a (broken line), and the second pad PAD2b is connected to the first pin PIN1 by means of a connection member W2b (broken line).

In the active state, a high level signal is fixedly supplied to the first pin PIN1, and accordingly, the first and second setting voltages Vset1 and Vset2 are each set to high level, whereby the semiconductor device 100 operates in the fourth state.

The set maker should set the second pin PIN2 to the non-connection state, or otherwise fixed at low level or fixed at high level.

2. Device which can Operate in the First State φ1 or the Fourth State φ4

The second pad PAD2a is connected to the second pin PIN2 by means of a connection member W2a (line of dashes and dots), and the second pad PAD2b is connected to the second pin PIN2 by means of a connection member W2b (line of dashes and dots).

With such an arrangement mounting the semiconductor device 100, the set maker supplies a second signal S2 to the second pin PIN2. If the second signal S2 is supplied as a voltage that corresponds to the low level, the semiconductor device 100 operates in the first state φ1, and if the second signal S2 is supplied as a voltage that corresponds to the high level, the semiconductor device 100 operates in the fourth state φ4.

3. Device which can Operate in the Third State φ3 or the Fourth State φ4

The second pad PAD2a is connected to the first pin PIN1 by means of a connection member W2a (broken line), and the second pad PAD2b is connected to the second pin PIN2 by means of a connection member W2b (line of dashes and dots).

With such an arrangement mounting the semiconductor device 100, the set maker supplies the second signal S2 to the second pin PIN2. If the second signal S2 is supplied as a voltage that corresponds to the low level, the semiconductor device 100 operates in the third state φ3, and if the second signal S2 is supplied as a voltage that corresponds to the high level, the semiconductor device 100 operates in the fourth state φ4.

4. Device which can Operate in the Second State φ2 or the Fourth State φ4

The second pad PAD2a is connected to the second pin PIN2 by means of a connection member W2a (line of dashes and dots), and the second pad PAD2b is connected to the first pin PIN1 by means of a connection member W2b (broken line).

With such an arrangement mounting the semiconductor device 100, the set maker supplies the second signal S2 to the second pin PIN2. If the second signal S2 is supplied as a voltage that corresponds to the low level, the semiconductor device 100 operates in the second state φ2, and if the second signal S2 is supplied as a voltage that corresponds to the high level, the semiconductor device 100 operates in the fourth state φ4.

With such an arrangement shown in FIG. 2, instead of inputting various kinds of individual setting voltages Vset from the outside, the first signal P1 such as the power saving signal PS is used as a substitute for a setting voltage. Thus, such an arrangement reduces the number of pins required in the semiconductor device 100.

Furthermore, as described above, such an arrangement allows the supplier to provide a series of semiconductor devices 100 wherein the connection members W2 have various connection states. Thus, such an arrangement allows the supplier to meet varied requests from the set makers. With such an arrangement, the connection state of the wire bonding can be changed without involving effects on the manufacturing process (so-called front-end processing). Thus, there is no need to modify any photomask (reticle) for the semiconductor chip 2, thereby allowing the same type of devices having various kinds of functions to be developed and supplied. The same can be said of an arrangement in which the semiconductor device 100 has a CSP structure, and rerouting wires are used as the connection members W.

The semiconductor device using the present invention can be distinguished from other devices based upon the following criterion. That is to say, where two or more types of devices having the same function (e.g., motor drivers) are supplied to the market by a supplier, and where the wiring connection states of these devices are varied according to the device types, it can be said that such a series of devices makes use of the present invention.

Next, description will be made regarding a modification of the first embodiment. It should be noted that the modification described below can be effectively applied to the second embodiment described later.

Description has been made regarding an arrangement with reference to FIG. 2, in which the power saving signal PS is applied as the first signal S1 input to the first pin PIN1 from outside. However, the present invention is not restricted to such an arrangement. For example, the first signal S1 may be the power supply voltage Vdd supplied from outside. With such an arrangement, a high-level signal is supplied to the first pin PIN1 in the operating state of the semiconductor chip 2, in the same way as with the first embodiment. Thus, such an arrangement provides the same advantages.

Alternatively, the signal S1 may be a notification signal which sends notice of the state of the semiconductor device 100 to the outside. Specifically, the signal S1 may be a notification signal which is set to a first level (high level) in the active state, and which is set to a second level (low level) in the inactive state. In this case, the first pad PAD1 is connected to an internal block configured in the semiconductor chip 2 to generate a notification signal. The first signal (notification signal) S1 is supplied to an external circuit of outside the semiconductor device 100 via the bonding wire W1 and the first pin PIN1.

Such an embodiment provides the same advantages.

In the embodiment, the first level can be taken to be low level, and the second level can be taken to be high level. In this case, a first signal is transmitted via the first pin PIN1 as an active-low signal.

For example, the low level of the first signal S1 may be the ground electric potential level, which is used as a reference voltage for the semiconductor chip 2.

Alternatively, the first signal S1 may be a power saving signal #PS or another notification signal which is set to a logical level (i.e., is an active-low signal) obtained by inverting the aforementioned power saving signal PS or the aforementioned notification signal.

[Second Embodiment]

Figure 3:
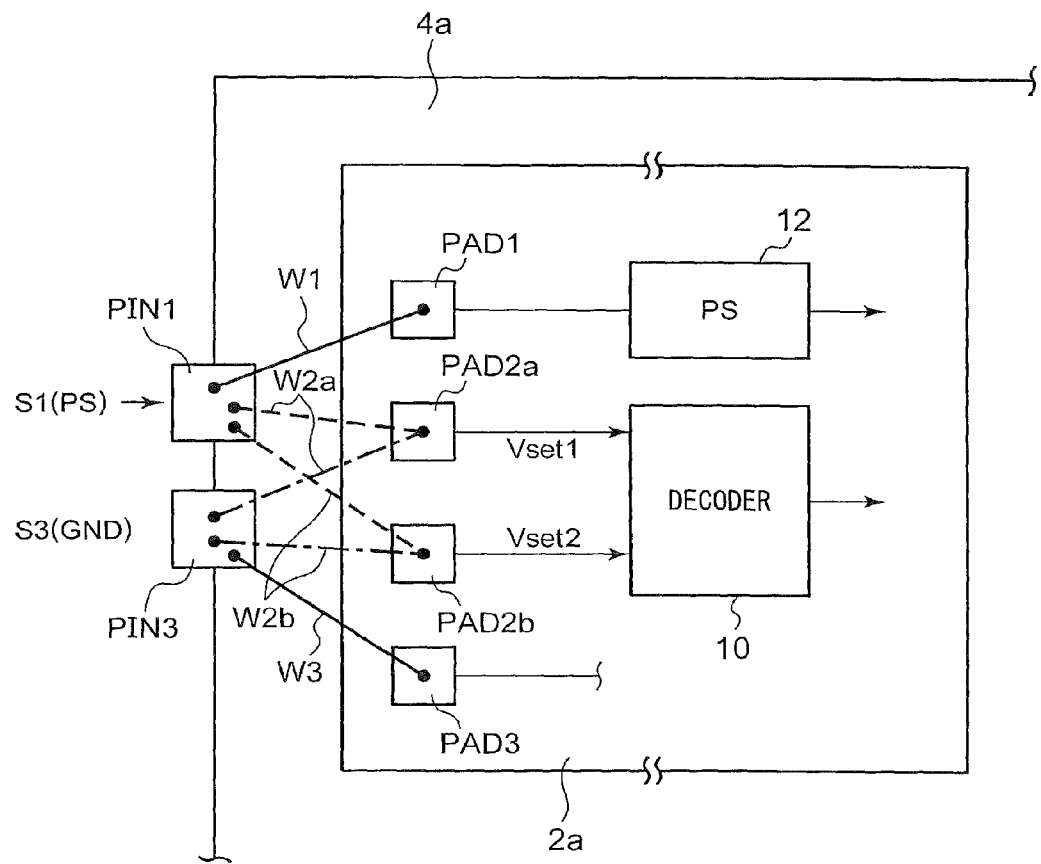
FIG. 3 is a diagram which shows a portion of a semiconductor device according to a second embodiment.

FIG. 3 is a diagram which shows a portion of a configuration of a semiconductor device 100a according to a second embodiment. Description of the same components as those in the first embodiment will be omitted. In the drawings, two pins PIN1 and PIN3, and four pads PAD1, PAD2a, PAD2b, and PAD3 are shown, and the other pins and pads are not shown. Such an arrangement allows the semiconductor device 100a to switch between four states in the same way as in the first embodiment.

The first pad PAD1 is arranged on a path for a first signal S1 which is set to a voltage that corresponds to a first level (hereafter taken to be high level) in the active state of the semiconductor device 100a. The first signal S1 is input to the semiconductor chip 2a from outside the semiconductor device 100a. Alternatively, the first signal S1 is output from the semiconductor chip 2a to outside the semiconductor device 100a.

For example, the first signal S1, which is transmitted via the first pad PAD1, is a power saving signal PS, as with the first embodiment. The first signal S1 is input from outside the semiconductor device 100a.

A power saving control unit 12 receives a power saving signal (first signal) PS, and controls the standby state of the semiconductor chip 2a according to the level of the power saving signal PS, thereby reducing power consumption in the semiconductor chip 2a.

The second pads PAD2a and PAD2b are provided in order to receive the setting voltages Vset1 and Vset2, and are connected to the decoder 10.

The third pad PAD3 is arranged on a path for a third signal S3 which is set to a second level (low level) when the semiconductor device 100 is in the active state. The third signal S3 is input to the semiconductor chip 2a from outside the semiconductor device 100a. Alternatively, the third signal S3 is a signal output from the semiconductor chip 2a to outside the semiconductor device 100a. In the present embodiment, the third signal S3 is supplied in the form of the ground voltage which is used as a reference voltage for the semiconductor chip 2a.

The first pin PIN1 is connected to the first pad PAD1 via the connection member W1. The first pin PIN1 receives a first signal from outside the semiconductor device 100a, or from the semiconductor chip 2 via the first pad PAD1. With the present embodiment, the first pin PIN1 receives a power saving signal PS from outside the semiconductor device 100a.

In the same way, the third pin PIN3 is connected to the third pad PAD3 via a connection member W3. The third pin PIN3 receives a third signal S3 from outside the semiconductor device 100a, or from the semiconductor chip 2a via the third pad PAD3. With the present embodiment, the third pin PIN5 receives the ground voltage GND from a outside the semiconductor device 100a. The ground voltage GND is supplied to each circuit block of the semiconductor chip 2a.

Next, description will be made regarding a suitable layout of the pads and the pins.

The first pad PAD1 and at least one pad, e.g., the second pads PAD2a and PAD2b, and the third pad PAD3 are arranged adjacently. Furthermore, the first pin PIN1 and the third pin PIN3 are arranged adjacently. Moreover, the first pad PAD1 is arranged at a position in the vicinity of the first pin PIN1. In addition, the second pads PAD2a and PAD2b are arranged in the vicinity of the first pin PIN1 and the third pin PIN3, and the third pad PAD3 is arranged at a position adjacent to the third pin PIN3.

The above is the basic configuration of the semiconductor device 100. Next, description will be made regarding the usage of the semiconductor device 100.

The supplier of the semiconductor device 100a varies the connection state of the second pads PAD2a and PAD2b for each kind of device.

1. Device which can Operate in the Fourth State φ4

The second pad PAD2a is connected to the first pin PIN1 by means of a connection member W2a (broken line), and the second pad PAD2b is connected to the first pin PIN1 by means of a connection member W2b (broken line).

In the active state, a high level signal is fixedly supplied to the first pin PIN1, and accordingly, the first and second setting voltages Vset1 and Vset2 are each set to high level, whereby the semiconductor device 100 operates in the fourth state.

2. Device which can Operate in the First State φ1

The second pad PAD2a is connected to the third pin PIN3 by means of a connection member W2a (line of dashes and dots), and the second pad PAD2b is connected to the third pin PIN3 by means of a connection member W2b (line of dashes and dots).

In the active state, a low level signal is fixedly supplied to the third pin PIN3, and accordingly, the first and second setting voltages Vset1 and Vset2 are each set to low level, whereby the semiconductor device 100a operates in the first state φ1.

3. Device which can Operate in the Third State φ3

The second pad PAD2a is connected to the first pin PIN1 by means of a connection member W2a (broken line), and the second pad PAD2b is connected to the third pin PIN3 by means of a connection member W2b (line of dashes and dots).

In the active state, a high level signal is fixedly supplied to the first pin PIN1, and a low level signal is fixedly supplied to the third pin PIN3. Accordingly, the first setting voltage Vset1 and the second setting voltage Vset2 are set to high level and low level, respectively. Thus, the semiconductor device 100a operates in the third state φ3.

4. Device which can Operate in the Second State φ2

The second pad PAD2a is connected to the third pin PIN3 by means of a connection member W2a (line of dashes and dots), and the second pad PAD2b is connected to the first pin PIN1 by means of a connection member W2b (broken line).

In the active state, a high level signal is fixedly supplied to the first pin PIN1, and a low level signal is fixedly supplied to the third pin PIN3. Accordingly, the first setting voltage Vset1 and the second setting voltage Vset2 are set to low level and high level, respectively. Thus, the semiconductor device 100a operates in the second state φ2.

With such an arrangement shown in FIG. 3, the first signal S1, which is an active-high logic level signal, and the third signal S3, which is an active-low logic level signal, are used as the setting voltages Vset. Thus, such an arrangement reduces the number of pins required for the semiconductor device 100.

Such an arrangement also allows the supplier to efficiently develop and supply the same types of devices having various functions.

The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention.

[Modification 1]

For example, in a case in which a given second pad PAD2 is pulled up by means of a resistor formed as an internal component of the semiconductor chip, in a case in which the set maker desires to set the setting voltage Vset that corresponds to this pad to high level, there is no need to connect this second pad PAD2 to any pin via a bonding wire.

[Modification 2]

Similarly, in a case in which a given second pad PAD2 is pulled down to the ground electric potential by means of a resistor formed as an internal component of the semiconductor chip, in a case in which the set maker desires to set the setting voltage Vset that corresponds to this pad to low level, there is no need to connect this second pad PAD2 to any pin via a bonding wire.

Figure 4:
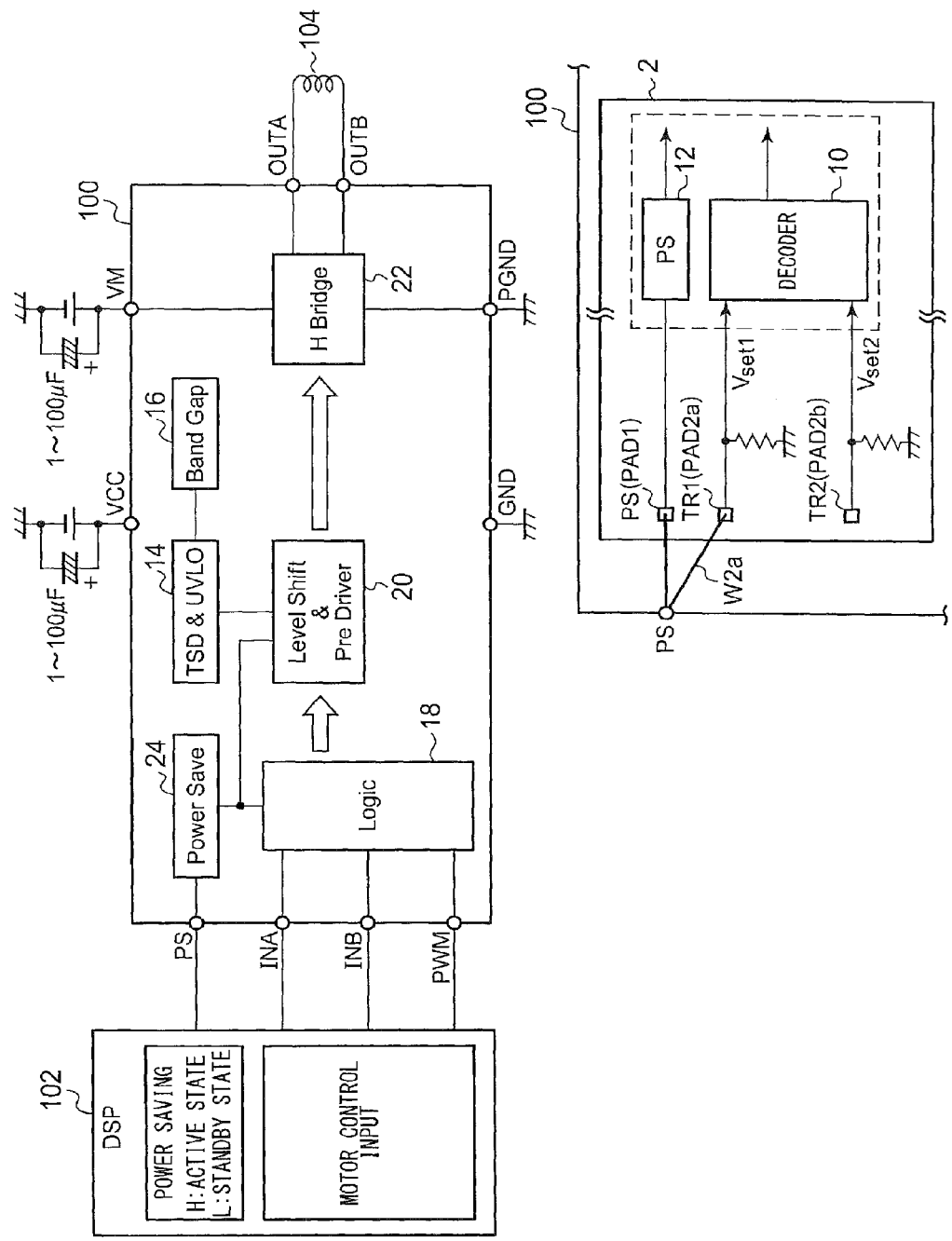
FIG. 4 is a diagram which shows a specific application of the semiconductor device shown in FIG. 2 or FIG. 3.

FIG. 4 is a diagram which shows a specific application of the semiconductor device shown in FIG. 2 or FIG. 3. The semiconductor device 100 shown in FIG. 4 is a motor driver IC configured to drive a single-phase motor (which will simply be referred to as the "motor" hereafter) according to control signals PS, INA, INB, and PWM, received from a DSP (Digital Signal Processor) 102.

As principal components, the semiconductor device 100 includes a thermal shutdown/low-voltage lockout circuit 14, a band gap reference (BGR) circuit 16, a logic unit 18, a level shifter/pre-driver circuit 20, an H-bridge circuit 22, and a power saving (PS) circuit 24.

The band gap reference circuit 16 generates a reference voltage Vref used by the internal components of the semiconductor device 100. The thermal shutdown/low-voltage lockout circuit 14 monitors the temperature of the semiconductor device 100 so as to detect an abnormal temperature. Furthermore, the thermal shutdown/low-voltage lockout circuit 14 monitors the power supply voltage received from the outside, and detects a low-voltage lockout state, which represents a state in which the power supply voltage is lower than a threshold voltage at which the semiconductor device 100 can operate. If the thermal shutdown/low-voltage lockout circuit 14 detects such an abnormal temperature or a low-voltage lockout state, the thermal shutdown/low-voltage lockout circuit 14 transmits a notice to the level shifter/pre-driver circuit 20.

The H-bridge circuit 22 is connected to the motor 104 via the output terminals OUTA and OUTB. A dedicated power supply voltage VM for a power block supplied via a VM terminal and a dedicated ground voltage for the power block supplied via a PGND terminal are supplied to the H-bridge circuit 22.

For blocks other than the power block, a dedicated power supply voltage and a dedicated ground voltage are supplied to a VCC terminal and a GND terminal, respectively.

The logic unit 18 receives the control signals INA, INB, and PWM from the DSP 102, and performs digital signal processing on the control signals thus received so as to generate a driving signal to be used to control the ON/OFF operations of four power transistors included in the H-bridge circuit 22. The level shifter/pre-driver circuit 20 receives the control signal from the logic unit 18, and level-shifts the control signal thus received so as to drive each power transistor included in the H-bridge circuit 22.

FIG. 5A is a table which shows the correspondence relations between the input signals and the output signals of the semiconductor device 100. When the power saving signal PS is high level, the semiconductor device 100 enters the active state. When the power saving signal is low level, the semiconductor device 100 enters the standby state.

The PWM terminal receives, as an input signal, the PWM signal which is an instruction to select the mode of the PWM control operation. When the PWM signal is high level, whether the output signals OUTA and OUTB are generated according to the forward rotation mode or the reverse rotation mode is determined by only the control signal INA which is one of the two control signals INA and INB. When the PWM signal is low level, whether the output signals OUTA and OUTB are generated is determined according to both the control signals INA and INB.

Returning to FIG. 4, the lower circuit diagram in FIG. 4 shows an enlarged diagram showing a block around the power saving circuit 24. The power saving circuit 24 corresponds to the decoder 10 and the power saving control unit 12 described with reference to FIGS. 2 and 3. A TR1 pad and a TR2 pad correspond to the aforementioned second pads PAD2*a* and PAD2*b*. As described in the aforementioned modification 2, in an arrangement shown in FIG. 4, the TR1 pad and the TR2 pad are each pulled down to the ground voltage (low level) via a resistor. That is to say, the TR1 pad and the TR2 pad are each set to low level by default.

As described above, the power saving control unit receives the power saving signal (first signal) PS, and controls the standby state of the semiconductor device 100 according to the level of the power saving signal PS thus received, thereby reducing power consumption of the semiconductor device 100.

The decoder 10 detects the values of the setting voltages Vset1 and Vset2 (high level or low level), which respectively occur at the TR1 terminal and the TR2 terminal, at a timing after the semiconductor chip 2 starts to operate, and determines the state of the semiconductor chip 2. With the semiconductor device 100, the TR1 pad and the TR2 pad are used to control the turn-on time and turn-off time of each power transistor included in the H-bridge circuit 22.

FIG. 5B is a table which shows the relation between the logical levels at the TR1 pad and the TR2 pad and the turn-on time and turn-off time. In a case in which the TR1 pad and the TR2 pad are each set to high level, these pads should be connected to the PS terminal by means of a connection member (W2*a*) such as bonding wires, rerouting wires, or the like. With such an arrangement, the TR1 pad and the TR2 pad are each pulled down via a resistor. Thus, in a case in which these pads are to be set to low level, there is no need to connect these pads to the PS terminal. In the state shown in FIG. 4, the TR1 pad is set to high level, and the TR2 pad is set to low level. Thus, the turn-on time is set to 250 ns, and the turn-off time is set to 70 ns.

As described above, with the semiconductor device 100 shown in FIG. 4, by wiring the TR1 pad and the TR2 pad according to the user's required specifications with respect to the turn-on time and the turn-off time before the molding (sealing) processing for the semiconductor device 100, such an arrangement can meet varied demands from the user.

While the preferred embodiments of the present invention have been described using specific terms, such description is for illustrative purposes only, and it is to be understood that changes and variations may be made without departing from the spirit or scope of the appended claims.

What is claimed is:

1. A semiconductor device comprising:
a plurality of pins;
a semiconductor chip having a plurality of pads which allow signals to be input and output, and configured to execute signal processing in one state selected from among a plurality of states according to at least one given setting voltage; and
connection members configured to connect the plurality of pads to corresponding pins,
wherein the plurality of pads comprises
a first pad arranged on a path for a first signal which is set to a voltage that corresponds to a first level when the semiconductor device is in an active state, and which is input to the semiconductor chip from outside the semiconductor device, or which is output from the semiconductor chip to outside the semiconductor device, and
at least one second pad configured to receive the aforementioned at least one setting voltage,
and wherein the plurality of pins comprises
a first pin which is connected to the first pad via the connection member, and which is configured to receive the first signal from outside the semiconductor device or from the semiconductor chip via the first pad, and
a second pin configured to receive a second signal which is set to a voltage that corresponds to the first level or a second level that is the complement of the first level.

2. A semiconductor device according to claim 1, wherein the first pad and the aforementioned at least one second pad are arranged adjacent to one another,
and wherein the first pin and the second pin are adjacently arranged,
and wherein the first pad is arranged at a position in the vicinity of the first pin,
and wherein the aforementioned at least one second pad is arranged at a position in the vicinity of the first pin and the second pin.

3. A semiconductor device according to claim 1, wherein the first signal is a power saving signal which is set to a voltage that corresponds to the first level when the semiconductor device is to be in the active state, and which is set to a voltage that corresponds to the second level when the semiconductor device is to be in the standby state.

4. A semiconductor device according to claim 1, wherein the first level is high level, and the first signal is supplied as a power supply voltage from the outside.

5. A semiconductor device according to claim 1, wherein the first level is low level, and the first signal is supplied as a ground voltage which is to be used as a reference voltage for the semiconductor chip.

6. A semiconductor device according to claim 1, wherein the first signal is a notification signal which is used to send notice of the state of the semiconductor device to outside the semiconductor device,
and wherein the first signal is set to the first level when the semiconductor device is in the active state, and is set to the second level when the semiconductor device in the inactive state.

7. A semiconductor device according to claim 1, wherein the connection member is configured as a bonding wire.

8. A semiconductor device according to claim 1, wherein the semiconductor device is configured as a chip size package, and the connection member is configured as a rerouting wire.

9. A semiconductor device according to claim 1, wherein the semiconductor chip comprises:
a bridge circuit including a plurality of power transistors connected to a motor to be driven;
a logic unit configured to receive a control signal which is an instruction to drive the motor, and to generate a driving signal which instructs the plurality of power transistors to perform ON/OFF operations; and
a pre-driver configured to drive the plurality of power transistors according to the driving signal.

10. A semiconductor device comprising:
a plurality of pins;
a semiconductor chip having a plurality of pads which allow signals to be input and output, and configured to execute signal processing in one state selected from among a plurality of states according to at least one given setting voltage; and connection members configured to connect the plurality of pads to the corresponding pins, wherein the plurality of pads comprises a first pad arranged on a path for a first signal which is set to a voltage that corresponds to a first level when the semiconductor device is in an active state, and which is input to the semiconductor chip from outside the semiconductor device, or which is output from the semiconductor chip to outside the semiconductor device, at least one second pad configured to receive the aforementioned at least one setting voltage, and a third pad arranged on a path for a third signal which is set to a voltage that corresponds to a second level when the semiconductor device is in the active state, and which is input to the semiconductor chip from outside the semiconductor device, or which is output from the semiconductor chip to outside the semiconductor device, and wherein the plurality of pins comprises a first pin which is connected to the first pad via the connection member, and is configured to receive the first signal from outside the semiconductor device or from the semiconductor chip via the first pad, and a third pin which is connected to the third pad via the connection member, and is configured to receive the third signal from outside the semiconductor device or from the semiconductor chip via the third pad, and wherein the first pad, the aforementioned at least one second pad, and the third pad are arranged adjacently, and wherein the first pin and the third pin are arranged adjacently, and wherein the first pad is arranged at a position in the vicinity of the first pin, and wherein the aforementioned at least one second pad is arranged in the vicinity of the first pad and the third pad, and wherein the third pad is arranged at a position in the vicinity of the third pin.

11. A semiconductor device according to claim 10, wherein the first signal is a power saving signal which is set to a voltage that corresponds to the first level when the semiconductor device is to be in the active state, and which is set to a voltage that corresponds to the second level when the semiconductor device is to be in the standby state.

12. A semiconductor device according to claim 10, wherein the first level is high level, and the first signal is supplied as a power supply voltage from the outside.

13. A semiconductor device according to claim 10, wherein the first level is low level, and the first signal is supplied as a ground voltage which is to be used as a reference voltage for the semiconductor chip.

14. A semiconductor device according to claim 10, wherein the first signal is a notification signal which is used to send notice of the state of the semiconductor device to outside the semiconductor device, and wherein the first signal is set to the first level when the semiconductor device is in the active state, and is set to the second level when the semiconductor device in the inactive state.

15. A semiconductor device according to claim 10, wherein the connection member is configured as a bonding wire.

16. A semiconductor device according to claim 10, wherein the semiconductor device is configured as a chip size package, and the connection member is configured as a rerouting wire.

17. A semiconductor device according to claim 10, wherein the semiconductor chip comprises:

a bridge circuit including a plurality of power transistors connected to a motor to be driven;

a logic unit configured to receive a control signal which is an instruction to drive the motor, and to generate a driving signal which instructs the plurality of power transistors to perform ON/OFF operations; and a pre-driver configured to drive the plurality of power transistors according to the driving signal.

18. A semiconductor device comprising:

a plurality of pins;

a semiconductor chip having a plurality of pads which allow signals to be input and output, and configured to execute signal processing in one state selected from among a plurality of states according to at least one given setting voltage; and connection members configured to connect the plurality of pads to the corresponding pins, wherein the plurality of pads comprises a first pad arranged on a path for a first signal which is set to a voltage that corresponds to a first level when the semiconductor device is in an active state, and which is input to the semiconductor chip from outside the semiconductor device, or which is output from the semiconductor chip to outside the semiconductor device, and at least one second pad configured to receive the aforementioned at least one setting voltage, and wherein the plurality of pins comprises a first pin which is connected to the first pad via the connection member, and which is configured to receive the first signal from outside the semiconductor device or from the semiconductor chip via the first pad, and wherein the aforementioned at least one second pad is pulled up or pulled down to a voltage that corresponds to a second level that is the complement of the first level when the semiconductor device is in the active state.

19. A semiconductor device according to claim 18, wherein the first signal is a power saving signal which is set to a voltage that corresponds to the first level when the semiconductor device is to be in the active state, and which is set to a voltage that corresponds to the second level when the semiconductor device is to be in the standby state.

20. A semiconductor device according to claim 18, wherein the first level is high level, and the first signal is supplied as a power supply voltage from the outside.

21. A semiconductor device according to claim 18, wherein the first level is low level, and the first signal is supplied as a ground voltage which is to be used as a reference voltage for the semiconductor chip.

22. A semiconductor device according to claim 18, wherein the first signal is a notification signal which is used to send notice of the state of the semiconductor device to outside the semiconductor device, and wherein the first signal is set to the first level when the semiconductor device is in the active state, and is set to the second level when the semiconductor device in the inactive state.

23. A semiconductor device according to claim 18, wherein the connection member is configured as a bonding wire.

24. A semiconductor device according to claim 18, wherein the semiconductor device is configured as a chip size package, and the connection member is configured as a rerouting wire.

25. A semiconductor device according to claim 18, wherein the semiconductor chip comprises:
   a bridge circuit including a plurality of power transistors connected to a motor to be driven;
   a logic unit configured to receive a control signal which is an instruction to drive the motor, and to generate a driving signal which instructs the plurality of power transistors to perform ON/OFF operations; and
   a pre-driver configured to drive the plurality of power transistors according to the driving signal.

* * * * *